United States Patent
Ono et al.

(10) Patent No.: US 12,407,373 B2
(45) Date of Patent: Sep. 2, 2025

(54) ACOUSTIC WAVE FILTER CIRCUIT, MULTIPLEXER, FRONT-END CIRCUIT, AND COMMUNICATION APPARATUS

(71) Applicant: Murata Manufacturing Co., Ltd., Nagaokakyo (JP)

(72) Inventors: Atsushi Ono, Nagaokakyo (JP); Hirotsugu Mori, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 373 days.

(21) Appl. No.: 18/174,677

(22) Filed: Feb. 27, 2023

(65) Prior Publication Data

US 2023/0216536 A1 Jul. 6, 2023

Related U.S. Application Data

(63) Continuation of application No. PCT/JP2021/024343, filed on Jun. 28, 2021.

(30) Foreign Application Priority Data

Aug. 28, 2020 (JP) .................. 2020-144705

(51) Int. Cl.
  *H04B 1/50* (2006.01)
  *H03H 9/64* (2006.01)
  (Continued)

(52) U.S. Cl.
  CPC ............... *H04B 1/50* (2013.01); *H03H 9/64* (2013.01); *H03H 9/72* (2013.01); *H04B 1/54* (2013.01)

(58) Field of Classification Search
  CPC ............ H04B 1/40–54; H03H 9/64–725
  See application file for complete search history.

(56) References Cited

U.S. PATENT DOCUMENTS

2013/0077551 A1* 3/2013 Lo .................. H04W 72/20
  370/312
2016/0006556 A1 1/2016 Pehlke et al.
  (Continued)

FOREIGN PATENT DOCUMENTS

JP 2004-266361 A 9/2004
WO 2016/158954 A1 10/2016
  (Continued)

OTHER PUBLICATIONS

International Search Report and Written Opinion mailed on Sep. 21, 2021, received for PCT Application PCT/JP2021/024343, filed on Jun. 28, 2021, 8 pages including English Translation.
  (Continued)

*Primary Examiner* — Brendan Y Higa
(74) *Attorney, Agent, or Firm* — XSENSUS LLP

(57) ABSTRACT

A frequency division duplex (FDD) first band includes a first downlink operating band and a first uplink operating band. An FDD second band includes a second downlink operating band and a second uplink operating band. In the FDD first band and the FDD second band, (1) the first downlink operating band, second downlink operating band, first uplink operating band, and second uplink operating band are positioned in order from lowest to highest frequency. The frequency range of the first uplink operating band and that of the second uplink operating band do not overlap each other. A filter is formed in or on a first substrate having piezoelectric properties and has a pass band including the first and second uplink operating bands.

19 Claims, 7 Drawing Sheets

(51) Int. Cl.
*H03H 9/72* (2006.01)
*H04B 1/54* (2006.01)

(56) References Cited

U.S. PATENT DOCUMENTS

| 2016/0072618 A1* | 3/2016 | Liao | H04B 1/525 |
| | | | 370/278 |
| 2016/0127015 A1 | 5/2016 | Wloczysiak et al. | |
| 2016/0268998 A1* | 9/2016 | Xu | H03H 9/0004 |
| 2019/0190564 A1* | 6/2019 | Cook | H04B 1/0064 |

FOREIGN PATENT DOCUMENTS

| WO | 2017/199649 A1 | 11/2017 |
| WO | 2019/059085 A1 | 3/2019 |
| WO | 2019/176538 A1 | 9/2019 |

OTHER PUBLICATIONS

3GPP, "Evolved Universal Terrestrial Radio Access (E-UTRA); User Equipment (UE) radio transmission and reception (Release 16)", 3GPP TS 36.101 V16.5.0, Mar. 2020, pp. 1-613.
Moderator (Huawei), "Email discussion summary for [94e Bis][33] NR_n13", 3GPP TSG-RAN WG4 Meeting # 94-e-Bis, R4-2005714, Apr. 20-30, 2020, 5 pages.

* cited by examiner

ACOUSTIC WAVE FILTER CIRCUIT, MULTIPLEXER, FRONT-END CIRCUIT, AND COMMUNICATION APPARATUS

CROSS-REFERENCE TO RELATED APPLICATIONS

This is a continuation application of PCT International Application No. PCT/JP2021/024343 filed on Jun. 28, 2021, designating the United States of America, which is based on and claims priority of Japanese Patent Application No. 2020-144705 filed on Aug. 28, 2020. The entire disclosures of the above-identified applications, including the specifications, drawings, and claims are incorporated herein by reference in their entirety.

BACKGROUND

1. Field of the Disclosure

The present disclosure relates to an acoustic wave filter circuit, a multiplexer, a front-end circuit, and a communication apparatus.

2. Description of the Related Art

It is desirable that a multiband- and multimode-support front-end circuit send and receive of multiple radio-frequency signals with low insertion and high isolation.

U.S. Patent Application Publication No. 2016/0127015 discloses a receiver module (transmit circuit) in which multiple filters whose pass bands are different from each other are connected to an antenna via a multiplexer (switch).

SUMMARY

The 3rd Generation Partnership Project (3GPP) specifies simultaneous transmission of multiple band signals, such as a radio-frequency signal of 5G (5th generation)—NR (New Radio) band and a radio-frequency signal of 4G (4th generation)—LTE (Long Term Evolution) band.

To transmit a radio-frequency signal of a first band and that of a second band having a small frequency gap, an individual filter may be used for each of the first and second bands to secure a sufficient level of isolation therebetween. This however increases the size of a front-end circuit.

One object of the present disclosure to provide an acoustic wave filter circuit, a multiplexer, a front-end circuit, and a communication apparatus which are small in size and which can also secure the isolation between two bands having a small frequency gap therebetween.

According to an aspect of the present disclosure, there is provided an acoustic wave filter circuit. A first band is used for frequency division duplex (FDD) communication and includes a first downlink operating band and a first uplink operating band. A second band is used for FDD communication and includes a second downlink operating band and a second uplink operating band. In the first band and the second band, (1) the first downlink operating band, the second downlink operating band, the first uplink operating band, and the second uplink operating band are positioned in order from lowest to highest frequency or from highest to lowest frequency or (2) the first downlink operating band, the first uplink operating band, the second uplink operating band, and the second downlink operating band are positioned in order from lowest to highest frequency or from highest to lowest frequency. A frequency range of the first uplink operating band and a frequency range of the second uplink operating band do not overlap each other. The acoustic wave filter circuit is formed in or on a first substrate having piezoelectric properties and has a pass band including the first and second uplink operating bands.

According to an aspect of the present disclosure, there is provided an acoustic wave filter circuit. A first band is used for FDD communication and includes a first downlink operating band and a first uplink operating band. A second band is used for FDD communication and includes a second downlink operating band and a second uplink operating band. In the first band and the second band, the first downlink operating band, the second uplink operating band, the first uplink operating band, and the second downlink operating band are positioned in order from lowest to highest frequency or from highest to lowest frequency. A frequency range of the first uplink operating band and a frequency range of the second uplink operating band do not overlap each other. The acoustic wave filter circuit is formed in or on a first substrate having piezoelectric properties and has a pass band including the first and second uplink operating bands.

According to an aspect of the present disclosure, there is provided an acoustic wave filter circuit. A first band is used for time division duplex (TDD) communication and includes a first downlink operating band and a first uplink operating band. A second band is used for FDD communication and includes a second downlink operating band and a second uplink operating band. The first downlink operating band and the first uplink operating band have an identical frequency range. In the first band and the second band, the first band, the second uplink operating band, and the second downlink operating band are positioned in order from lowest to highest frequency or from highest to lowest frequency. A frequency range of the first band and a frequency range of the second uplink operating band do not overlap each other. The acoustic wave filter circuit is formed in or on a first substrate having piezoelectric properties and has a pass band including the first and second uplink operating bands.

According to an aspect of the present disclosure, there is provided a multiplexer. The multiplexer includes an antenna connecting terminal, one of the above-described acoustic wave filter circuits, and a first filter circuit. The acoustic wave filter circuit is connected to the antenna connecting terminal. The first filter circuit is connected to the antenna connecting terminal and has a pass band including the first and second downlink operating bands. The first filter circuit is formed in or on a second substrate, which is different from the first substrate.

According to an aspect of the present disclosure, there is provided a multiplexer. The multiplexer includes an antenna connecting terminal, one of the above-described acoustic wave filter circuits, and a first filter circuit. The acoustic wave filter circuit is connected to the antenna connecting terminal. The first filter circuit is connected to the antenna connecting terminal and has a pass band including the first and second downlink operating bands. An electrode forming the acoustic wave filter circuit contacts a first dielectric layer formed on the first substrate. An electrode forming the first filter circuit contacts a second dielectric layer, which is different from the first dielectric layer, formed on the first substrate.

According to an aspect of the present disclosure, there is provided a front-end circuit. The front-end circuit includes an antenna connecting terminal, one of the above-described acoustic wave filter circuits, a second filter circuit, a power amplifier, a switch, and an impedance matching circuit. The acoustic wave filter circuit is connected to the antenna connecting terminal. The second filter circuit is connected to the antenna connecting terminal and has a pass band including a third uplink operating band of a third band. A frequency range of the third band overlaps neither of the first band nor the second band. The power amplifier is able to amplify radio-frequency signals of the first, second, and third bands. The switch selectively connects the acoustic wave filter circuit or the second filter circuit to the power amplifier. The impedance matching circuit is connected between the power amplifier and the switch and varies impedance in accordance with whether the switch connects the acoustic wave filter circuit or the second filter circuit to the power amplifier.

According to an aspect of the present disclosure, there is provided a communication apparatus. The communication apparatus includes a signal processing circuit and the above-described front-end circuit. The signal processing circuit processes a radio-frequency signal. The front-end circuit transmits the radio-frequency signal between the signal processing circuit and an antenna.

According to an embodiment of the disclosure, it is possible to provide an acoustic wave filter circuit, a multiplexer, a front-end circuit, and a communication apparatus which are small in size and which can also secure the isolation between two bands having a small frequency gap therebetween.

DETAILED DESCRIPTION

Figure 1:
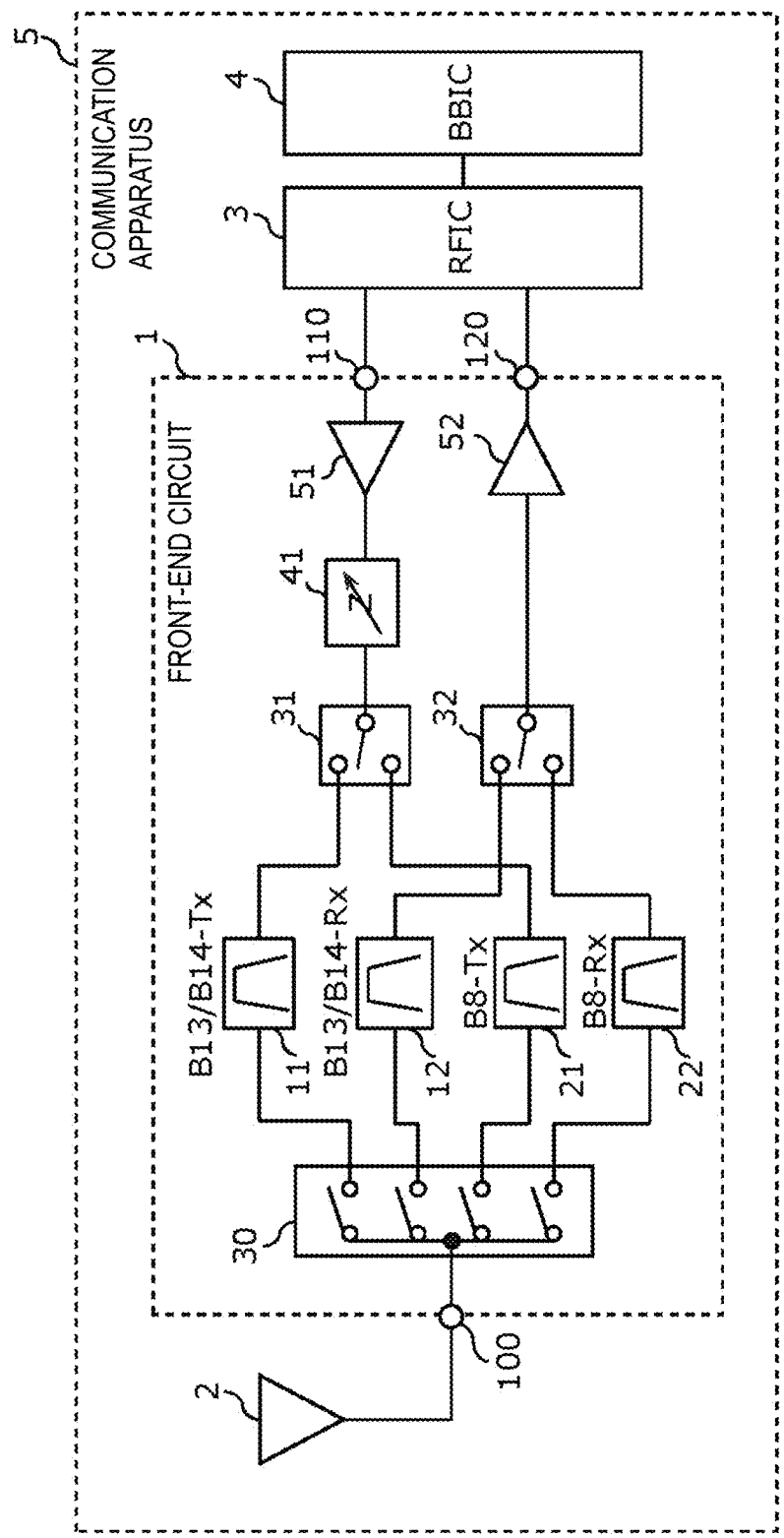
FIG. 1 is a circuit diagram of a front-end circuit and a communication apparatus according to an embodiment.

An embodiment of the disclosure will be described below in detail with reference to the accompanying drawings. The embodiment described below illustrates general or specific examples. Numerical values, configurations, materials, components, and positions and connection states of the components illustrated in the following embodiment are only examples and are not intended to be limiting.

The drawings are only schematically shown and are not necessarily precisely illustrated. For the sake of representation, the drawings are illustrated in an exaggerated manner or with omissions and the ratios of components in the drawings are adjusted. The configurations, positional relationships, and ratios of components in the drawings may be different from those of the actual components. In the drawings, substantially identical components are designated by like reference numeral, and an explanation of such components will not be repeated or be merely simplified.

In the disclosure, "A is connected to B" includes, not only the meaning that A is directly connected to B using a connecting terminal and/or a wiring conductor, but also the meaning that A is electrically connected to B via another circuit element. "Being connected between A and B" means that "being connected to both A and B on a path which connects A and B".

Embodiment

[1 Circuit Configurations of Front-End Circuit 1 and Communication Apparatus 5]

The circuit configurations of a front-end circuit 1 and a communication apparatus 5 according to an embodiment will be described below with reference to FIG. 1. FIG. 1 is a circuit diagram of the front-end circuit 1 and the communication apparatus 5 according to the embodiment.

[1.1 Circuit Configuration of Communication Apparatus 5]

The circuit configuration of the communication apparatus 5 will first be explained. As illustrated in FIG. 1, the communication apparatus 5 according to the embodiment includes a front-end circuit 1, an antenna 2, a radio-frequency (RF) signal processing circuit 3, and a baseband signal processing circuit 4. Hereinafter, the radio-frequency (RF) signal processing circuit 3 will be called a radio-frequency integrated circuit (RFIC) 3, and the baseband signal processing circuit 4 will be called a baseband integrated circuit (BBIC) 4.

The front-end circuit 1 transmits a radio-frequency signal between the antenna 2 and the RFIC 3. The detailed circuit configuration of the front-end circuit 1 will be discussed later.

The antenna 2 is connected to an antenna connecting terminal 100 of the front-end circuit 1. The antenna 2 sends a radio-frequency signal output from the front-end circuit 1 and also receives a radio-frequency signal from an external source and outputs it to the front-end circuit 1.

The RFIC 3 is an example of a signal processing circuit that processes a radio-frequency signal. The RFIC 3 will be explained more specifically. The RFIC 3 performs signal processing, such as down-conversion, on a radio-frequency received signal which is received via a receive path of the front-end circuit 1 and outputs the resulting received signal to the BBIC 4. The RFIC 3 also performs signal processing, such as up-conversion, on a sending signal received from the BBIC 4 and outputs the resulting radio-frequency sending signal to a sending path of the front-end circuit 1. The RFIC 3 includes a controller that controls components, such as switches and amplifiers, of the front-end circuit 1. All or some of the functions of the RFIC 3 as the controller may be installed in a source outside the RFIC 3, such as in the BBIC 4 or the front-end circuit 1.

The BBIC 4 is a baseband signal processing circuit that performs signal processing by using an intermediate-frequency band, which is lower than a radio-frequency signal transmitted by the front-end circuit 1. Examples of signals to be processed by the BBIC 4 are image signals for displaying images and/or audio signals for performing communication via a speaker.

The antenna 2 and the BBIC 4 are not essential components for the communication apparatus 5 of the embodiment.

[1.2 Circuit Configuration of Front-End Circuit 1]

The circuit configuration of the front-end circuit 1 will now be discussed below. As illustrated in FIG. 1, the front-end circuit 1 includes filters 11, 12, 21, and 22, a power amplifier 51, a low-noise amplifier 52, switches 30, 31, and 32, a matching circuit 41, the antenna connecting terminal 100, a radio-frequency input terminal 110, and a radio-frequency output terminal 120.

The antenna connecting terminal 100 is connected to the antenna 2. The radio-frequency input terminal 110 is a terminal for receiving a radio-frequency sending signal from the outside of the front-end circuit 1. The radio-frequency output terminal 120 is a terminal for outputting a radio-frequency received signal to the outside of the front-end circuit 1.

The power amplifier 51 is able to amplify radio-frequency sending signals (hereinafter simply called sending signals) of first, second, and third bands input from the radio-frequency input terminal 110. The power amplifier 51 is connected between the radio-frequency input terminal 110 and the switch 31.

The low-noise amplifier 52 is able to amplify radio-frequency received signals (hereinafter simply called received signals) of the first, second, and third bands input from the antenna connecting terminal 100. The low-noise amplifier 52 is connected between the radio-frequency output terminal 120 and the switch 32.

Each of the first, second, and third bands refers to a frequency band defined by a standards organization (such as 3GPP and Institute of Electrical and Electronics Engineers (IEEE)) for a communication system to be constructed using a radio access technology (RAT). In the embodiment, as the communication system, an LTE system, a 5G-NR system, and a wireless local area network (WLAN) system, for example, may be used. However, the communication system is not limited to these types of systems.

The first band is constituted by a first downlink operating band and a first uplink operating band. The second band is constituted by a second downlink operating band and a second uplink operating band. The third band is constituted by a third downlink operating band and a third uplink operating band.

The uplink operating band is a frequency range used for uplink communication in the first, second, or third band. The downlink operating band is a frequency range used for downlink communication in the first, second, or third band.

In the front-end circuit 1 of the embodiment, the first band is LTE band B13 for frequency division duplex (FDD) communication, the second band is LTE band B14 for FDD communication, and the third band is LTE band B8 for FDD communication.

The filter 11 is an example of an acoustic wave filter circuit and has a pass band including the first uplink operating band (first transmit band) of the first band and the second uplink operating band (second transmit band) of the second band. The filter 11 is connected to the antenna connecting terminal 100 via the switch 30. The filter 11 is a surface acoustic wave (SAW) filter or a bulk acoustic wave (BAW) filter.

The filter 12 is an example of a first filter circuit and has a pass band including the first downlink operating band (first receive band) of the first band and the second downlink operating band (second receive band) of the second band. The filter 12 is connected to the antenna connecting terminal 100 via the switch 30.

The filter 21 is an example of a second filter circuit and has a pass band including the third uplink operating band of the third band. The filter 21 is connected to the antenna connecting terminal 100 via the switch 30.

The filter 22 has a pass band including the third downlink operating band of the third band. The filter 22 is connected to the antenna connecting terminal 100 via the switch 30.

The filters 21 and 22 may form a duplexer which allows a sending signal and a received signal of the third band to pass therethrough.

The switch 30 has a four single pole single throw (SPST) switch elements. One of the terminals of each of the switch elements is connected to the antenna connecting terminal 100. The other respective terminals of the switch elements are connected to the filters 11, 12, 21, and 22. With this configuration, based on a control signal from the RFIC 3, for example, the switch 30 selectively connects or disconnects the antenna connecting terminal 100 to or from the filter 11, selectively connects or disconnects the antenna connecting terminal 100 to or from the filter 12, selectively connects or disconnects the antenna connecting terminal 100 to or from the filter 21, and selectively connects or disconnects the antenna connecting terminal 100 to or from the filter 22. The number of switch elements of the switch 30 is suitably set in accordance with the number of filters of the front-end circuit 1.

The switch 31 is connected between the filters 11 and 21 and the power amplifier 51. More specifically, the switch 31 has one common terminal and two selection terminals. The common terminal is connected to the output terminal of the power amplifier 51 via the matching circuit 41. One selection terminal is connected to the filter 11 and the other selection terminal is connected to the filter 21. With this connection configuration, the switch 31 can selectively connect the filter 11 or the filter 21 to the power amplifier 51, based on a control signal from the RFIC 3, for example.

The switch 32 is connected between the filters 12 and 22 and the low-noise amplifier 52. More specifically, the switch 32 has one common terminal and two selection terminals. The common terminal is connected to the input terminal of the low-noise amplifier 52. One selection terminal is connected to the filter 12 and the other selection terminal is connected to the filter 22. With this connection configuration, the switch 32 can selectively connect the filter 12 or the filter 22 to the low-noise amplifier 52, based on a control signal from the RFIC 3, for example.

The matching circuit 41 is an example of an impedance matching circuit. The matching circuit 41 is connected between the power amplifier 51 and the switch 31 and varies the impedance in accordance with whether the switch 31 connects the filter 11 or the filter 21 to the power amplifier 51.

The provision of the switch 30 may be omitted and each of the filters 11, 12, 21, and 22 may be directly connected to the antenna connecting terminal 100.

In the front-end circuit 1 configured as described above, the filters 11 and 12 and the switch 30 form a multiplexer. The provision of the switch 30 may be omitted from the multiplexer and the filters 11 and 12 may be directly connected to the antenna connecting terminal 100.

The provision of some of the circuit elements shown in FIG. 1 in the front-end circuit 1 may be omitted. For example, it is sufficient that the front-end circuit 1 includes at least the filters 11 and 21, power amplifier 51, switch 31, and matching circuit 41.

[1.3 Relationships among Bands]

Figure 2:
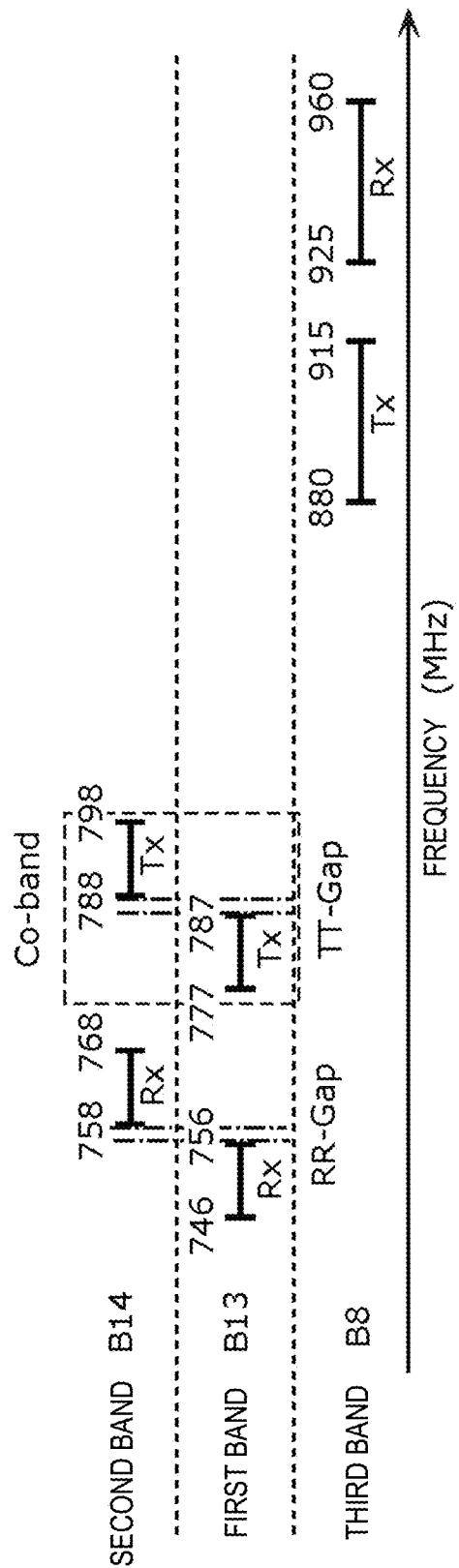
FIG. 2 illustrates an example of the relationships among bands in the embodiment.

The relationships among the first band, second band, and third band in the embodiment will be explained below with reference to FIG. 2. FIG. 2 illustrates an example of the relationships among bands in the embodiment.

As illustrated in FIG. 2, the first band is LTE FDD band B13 where the first downlink operating band is 746 to 756 MHz and the first uplink operating band is 777 to 787 MHz. The second band is LTE FDD band B14 where the second downlink operating band is 758 to 768 MHz and the second uplink operating band is 788 to 798 MHz. The third band is LTE FDD band B8 where the third downlink operating band is 925 to 960 MHz and the third uplink operating band is 880 to 915 MHz.

That is, in the first and second bands, (1) the first downlink operating band, second downlink operating band, first uplink operating band, and second uplink operating band are positioned in order from lowest to highest frequency. The frequency range of the first uplink operating band and that of the second uplink operating band do not overlap each other. There is a frequency gap (TT-Gap: 1 MHz) between the first uplink operating band and the second uplink operating band. The frequency ranges of the third band overlap neither of the first band nor the second band.

The filter 11 of the embodiment is a co-band filter having a pass band including the first uplink operating band of the first band and the second uplink operating band of the second band.

Application examples of the first band and the second band in the embodiment will be discussed below.

Figure 3A:
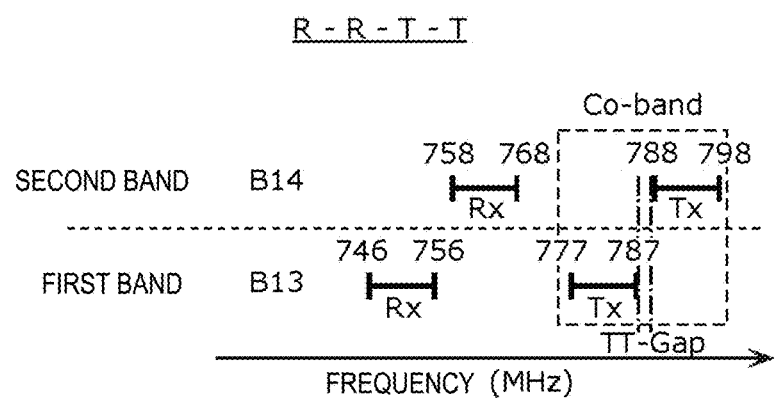
FIG. 3A illustrates a first example of a combination of bands in the embodiment.

FIG. 3A illustrates a first example of a combination of bands in the embodiment. In FIG. 3A, the application example of the first and second bands shown in FIG. 2 is illustrated. The first band is LTE FDD band B13, while the second band is LTE FDD band B14. In the first and second bands, (1) the first downlink operating band (R), second downlink operating band (R), first uplink operating band (T), and second uplink operating band (T) are positioned in order from lowest to highest frequency (R-R-T-T). There is a frequency gap (TT-Gap: 1 MHz) between the first uplink operating band and the second uplink operating band. In the first example, the filter 11 is a co-band filter having a pass band including the uplink operating band of band B13 and the uplink operating band of band B14.

Figure 3B:
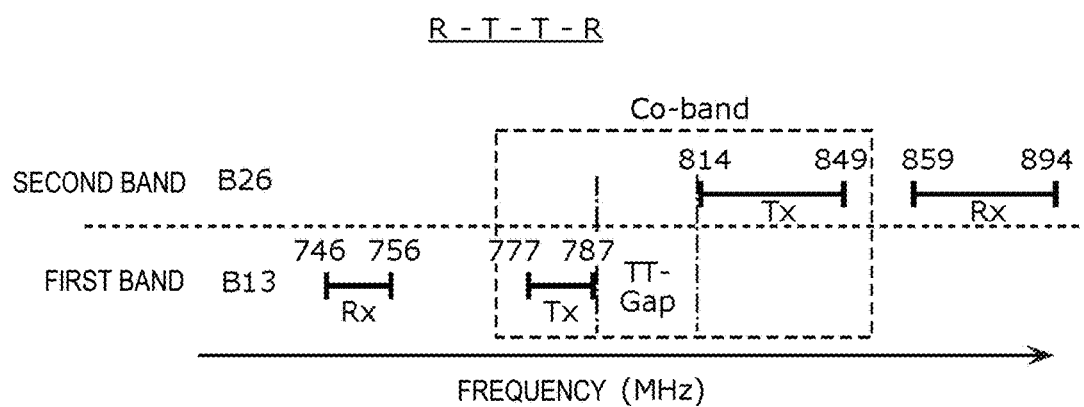
FIG. 3B illustrates a second example of a combination of bands in the embodiment.

FIG. 3B illustrates a second example of a combination of bands in the embodiment. The first band is LTE FDD band B13 where the first downlink operating band is 746 to 756 MHz and the first uplink operating band is 777 to 787 MHz. The second band is LTE FDD band B26 where the second downlink operating band is 859 to 894 MHz and the second uplink operating band is 814 to 849 MHz. In the first and second bands, (1) the first downlink operating band (R), first uplink operating band (T), second uplink operating band (T), and second downlink operating band (R) are positioned in order from lowest to highest frequency (R-T-T-R). There is a frequency gap (TT-Gap: 27 MHz) between the first uplink operating band and the second uplink operating band. In the second example, the filter 11 is a co-band filter having a pass band including the uplink operating band of band B13 and the uplink operating band of band B26.

Figure 3C:
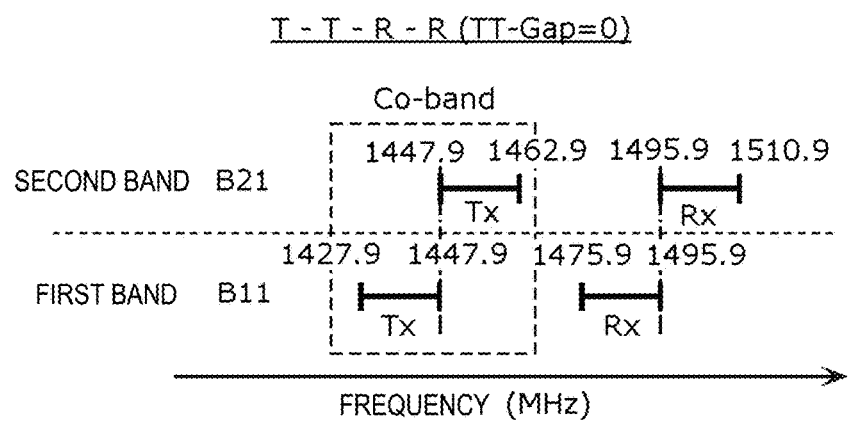
FIG. 3C illustrates a third example of a combination of bands in the embodiment.

FIG. 3C illustrates a third example of a combination of bands in the embodiment. The first band is LTE FDD band B11 where the first uplink operating band is 1427.9 to 1447.9 MHz and the first downlink operating band is 1475.9 to 1495.9 MHz. The second band is LTE FDD band B21 where the second uplink operating band is 1447.9 to 1462.9 MHz and the second downlink operating band is 1495.9 to 1510.9 MHz. In the first and second bands, (1) the first uplink operating band (T), second uplink operating band (T), first downlink operating band (R), and second downlink operating band (R) are positioned in order from lowest to highest frequency (T-T-R-R). The frequency range of the first uplink operating band and that of the second uplink operating band do not overlap each other. There is no frequency gap (TT-Gap: 0 MHz) between the first uplink operating band and the second uplink operating band. In the third example, the filter 11 is a co-band filter having a pass band including the uplink operating band of band B11 and the uplink operating band of band B21.

A fourth example (not shown) of a combination of bands in the embodiment will be discussed below. The first band is LTE FDD band B70 where the first uplink operating band is 1695 to 1710 MHz and the first downlink operating band is 1995 to 2020 MHz. The second band is LTE FDD band B66 where the second uplink operating band is 1710 to 2110 MHz and the second downlink operating band is 1780 to 2200 MHz. In the first and second bands, (1) the first uplink operating band (T), second uplink operating band (T), first downlink operating band (R), and second downlink operating band (R) are positioned in order from lowest to highest frequency (T-T-R-R). The frequency range of the first uplink operating band and that of the second uplink operating band do not overlap each other. There is no frequency gap (TT-Gap: 0 MHz) between the first uplink operating band and the second uplink operating band. In the fourth example, the filter 11 is a co-band filter having a pass band including the uplink operating band of band B70 and the uplink operating band of Band B66.

Figure 3D:
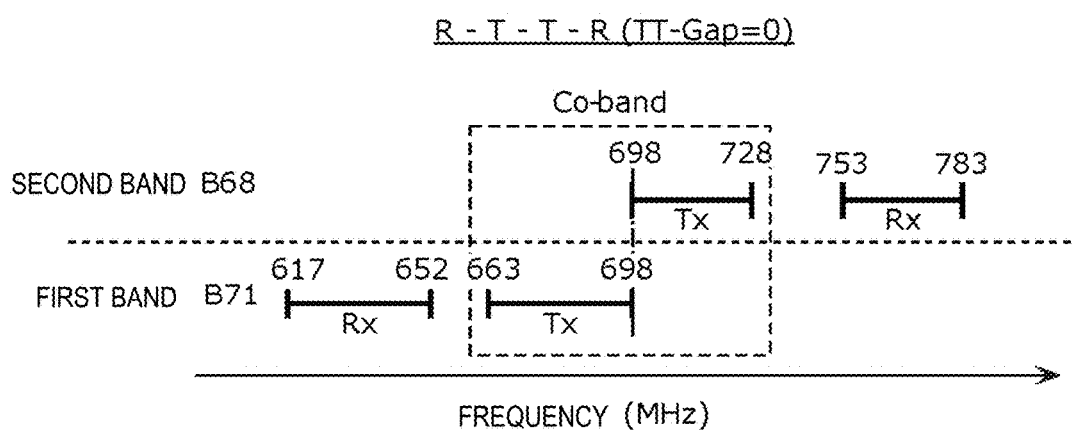
FIG. 3D illustrates a fifth example of a combination of bands in the embodiment.

FIG. 3D illustrates a fifth example of a combination of bands in the embodiment. The first band is LTE FDD band B71 where the first uplink operating band is 663 to 698 MHz and the first downlink operating band is 617 to 652 MHz. The second band is LTE FDD band B68 where the second uplink operating band is 698 to 728 MHz and the second downlink operating band is 753 to 783 MHz. In the first and second bands, (1) the first downlink operating band (R), first uplink operating band (T), second uplink operating band (T), and second downlink operating band (R) are positioned in order from lowest to highest frequency (R-T-T-R). The frequency range of the first uplink operating band and that of the second uplink operating band do not overlap each other. There is no frequency gap (TT-Gap: 0 MHz) between the first uplink operating band and the second uplink operating band. In the fifth example, the filter 11 is a co-band filter having a pass band including the uplink operating band of band B71 and the uplink operating band of band B68.

Figure 3E:
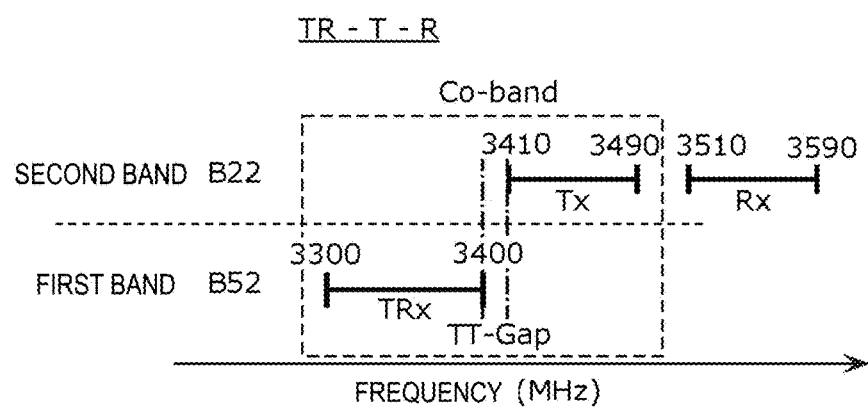
FIG. 3E illustrates a sixth example of a combination of bands in the embodiment.

FIG. 3E illustrates a sixth example of a combination of bands in the embodiment. The first band is LTE band B52 for time division duplex (TDD) communication where the first uplink operating band and the first downlink operating band have the same frequency range, which is 3300 to 3400 MHz. The second band is LTE FDD band B22 where the second uplink operating band is 3410 to 3490 MHz and the second downlink operating band is 3510 to 3590 MHz. In the first and second bands, (1) the first band (first downlink operating band and first uplink operating band) (TR), second uplink operating band (T), and second downlink operating band (R) are positioned in order from lowest to highest frequency (TR-T-R). There is a frequency gap (TT-Gap: 10 MHz) between the first uplink operating band and the second uplink operating band. In the sixth example, the filter 11 is a co-band filter having a pass band including the uplink operating band (and downlink operating band) of band B52 and the uplink operating band of band B22.

A seventh example (not shown) of a combination of bands in the embodiment will be discussed below. The first band is LTE TDD band B54 where the first uplink operating band and the first downlink operating band have the same frequency range, which is 1670 to 1675 MHz. The second band is LTE FDD band B24 where the second uplink operating band is 1626.5 to 1660.5 MHz and the second downlink operating band is 1525 to 1559 MHz. The second band may be band B255 for a non-terrestrial network (NTN). In the first and second bands, (1) the first band (first downlink operating band and first uplink operating band) (TR), second uplink operating band (T), and second downlink operating band (R) are positioned in order from highest to lowest frequency (TR-T-R). There is a frequency gap (TT-Gap: 9.5 MHz) between the first uplink operating band and the second uplink operating band. In the seventh example, the filter 11 is a co-band filter having a pass band including the uplink operating band (and downlink operating band) of band B54 and the uplink operating band of band B24.

LTE bands are used as the first and second bands of the above-described first through seventh examples. However, the first and second bands in the first through seventh examples may be NR bands or NTN bands.

Figure 3F:
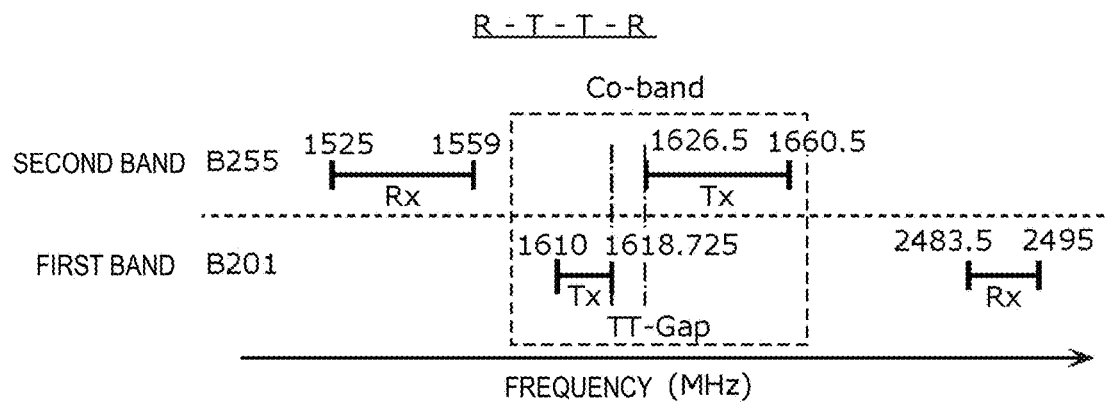
FIG. 3F illustrates an eighth example of a combination of bands in the embodiment.

FIG. 3F illustrates an eighth example of a combination of bands in the embodiment. The first band is NTN band B201 where the first uplink operating band is 1610 to 1618.725 MHz and the first downlink operating band is 2483.5 to 2495 MHz. The second band is NTN band B255 where the second uplink operating band is 1626.5 to 1660.5 MHz and the second downlink operating band is 1525 to 1559 MHz. In the first and second bands, (1) the first downlink operating band (R), second uplink operating band (T), first uplink operating band (T), and second downlink operating band (R) are positioned in order from highest to lowest frequency (R-T-T-R). The frequency range of the first uplink operating band and that of the second uplink operating band do not overlap each other. The uplink operating band of band B201 is extendable up to 1626.5 MHz. In this case, there is no frequency gap (TT-Gap: 0 MHz) between the first uplink operating band and the second uplink operating band. In the eighth example, the filter 11 is a co-band filter having a pass band including the uplink operating band of band B201 and the uplink operating band of band B255.

NTN bands applicable as the first and second bands in the embodiment are not limited to a combination of band B201 and band B255.

[1.4 Filter Structure]

The structures of the filters 11 and 12 using the first and second bands having the above-described frequency relationship as their pass bands will be described below.

The filter 11 is an acoustic wave filter formed in or on a single first substrate having piezoelectric properties and has a pass band including the first and second uplink operating bands.

According to the above-described frequency relationship between the first band and the second band, the first uplink operating band and the second uplink operating band are adjacent to each other without having the first and second downlink operating bands interposed therebetween. Because of this positional relationship, if a SAW filter is used to form the filter 11, the pass band including the first and second uplink operating bands of the filter 11 can be formed by using the same interdigital transducer (IDT) electrode. Because of the characteristics of a SAW filter, the downlink operating bands adjacent to the pass band of the filter 11 can be sharply attenuated. It is thus possible to implement a small acoustic wave filter circuit which can use two uplink operating bands as the same pass band and which can sufficiently attenuate downlink operating bands adjacent to the pass band.

It is desirable that the filter 11 have a small temperature coefficient of frequency (TCF). More specifically, the TCF of the filter 11 is preferably 10 ppm/° C. or smaller. With this TCF value, the frequency drift of the pass band of the filter 11 is unlikely to occur even with a temperature rise in the filter 11 through which a high-frequency sending signal passes. It is thus possible to secure a sufficiently large attenuation of the downlink operating bands in the filter 11.

Figure 4:
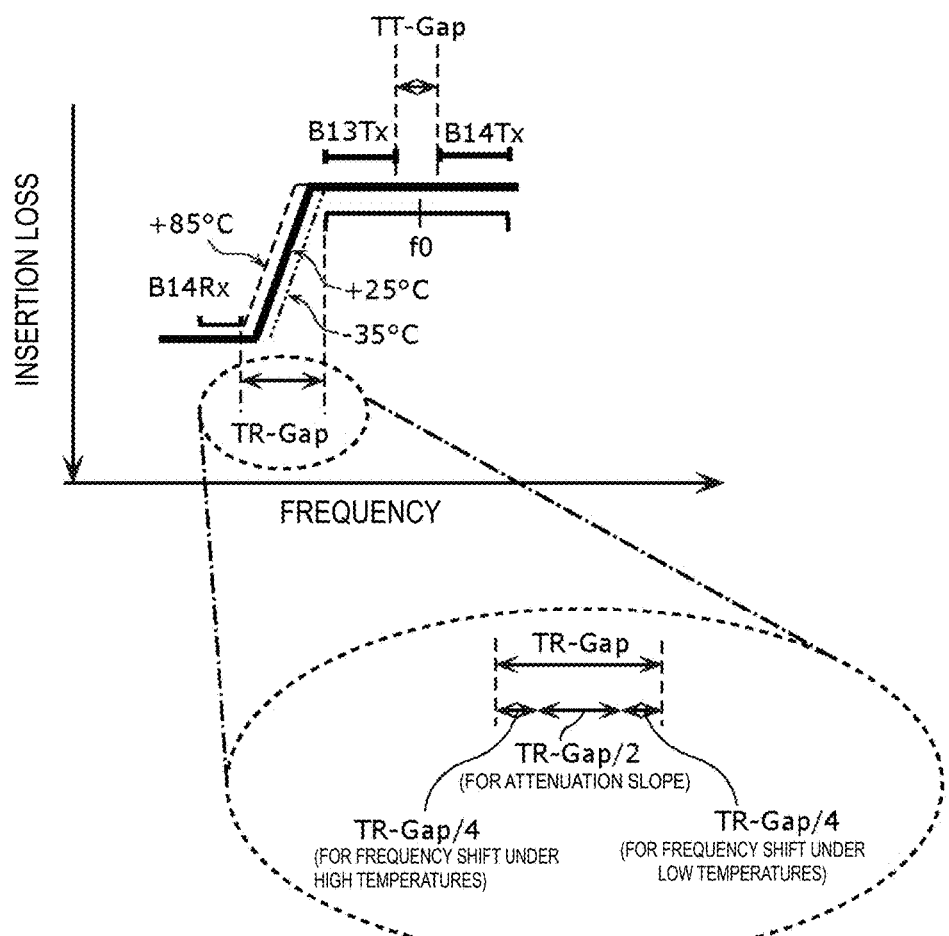
FIG. 4 illustrates the specifications required for a temperature coefficient of frequency of an acoustic wave filter circuit according to the embodiment.

FIG. 4 illustrates the specifications required for the TCF of the filter 11 of the embodiment. In FIG. 4, the allowances for frequency changes of the pass band of the filter 11 caused by temperature changes are shown.

When the pass band is shifted to the lower frequency side under a high temperature (+85° C.), the attenuation in the attenuation band on the lower frequency side than the pass band of the filter 11 may unfavorably be decreased. In this case, the amount by which the pass band is shifted (the shift amount of the pass band) to the lower frequency side is desirably within ¼ of the frequency gap TR-gap between the first uplink operating band (B13Tx) of band B13, which forms the lower frequency side of the pass band of the filter 11, and the second downlink operating band (B14Rx) of band B14, which is adjacent to the first uplink operating band (B13Tx).

When the pass band is shifted to the higher frequency side under a low temperature (−35° C.), the attenuation in the attenuation band on the higher frequency side than the pass band of the filter 11 may unfavorably be decreased. In this case, the amount by which the pass band is shifted (the shift amount of the pass band) to the higher frequency side is desirably within ¼ of the frequency gap TR-gap between the second uplink operating band (B14Tx) of band B14, which forms the higher frequency side of the pass band of the filter 11, and the attenuation band adjacent to the second uplink operating band (B14Tx).

That is, it is desirable that the TCF (ppm/° C.) of the filter 11 satisfy the following relational expression (1):

$$TCF \leq |[(f0 \pm fgap/4) - f0]/f0/\Delta T \times 1000000| \quad (1)$$

where f0 is the center frequency (Hz) of the pass band of the filter 11, fgap is the frequency gap (Hz) between the first uplink operating band and the first or second downlink operating band adjacent to the first uplink operating band, and ΔT is the largest temperature shift from room temperature (25° C.)

When the TCF of the filter 11 satisfies the above relational expression (1), a large attenuation can be secured in the attenuation band on the lower frequency side of the pass band under high temperatures, while a large attenuation can be secured in the attenuation band on the higher frequency side of the pass band under low temperatures.

When NR bands are used as the first and second bands, the required error vector magnitude (EVM) is highly demanding, and it is thus necessary to secure a higher level of isolation between a sending signal and a received signal. To meet this demand, if the TCF of the filter 11 is set to satisfy the above relational expression (1), the EVM of received signals of the first and second bands can be reduced.

Figure 5:
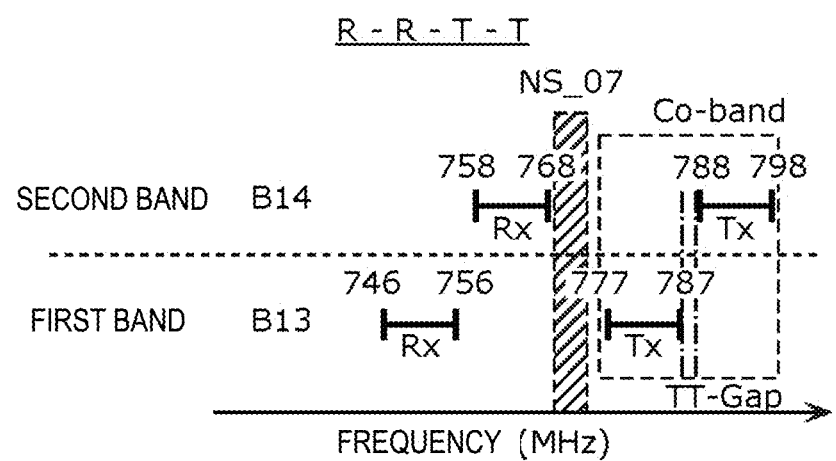
FIG. 5 illustrates the position of NS_07 in the first example of a combination of bands in the embodiment.

FIG. 5 illustrates the position of NS_07 in the first example of a combination of bands in the embodiment. When the combination of the first and second bands in the first example is used, NS_07 (769 to 775 MHz) is positioned between the second downlink operating band (758 to 768 MHz) and the first uplink operating band (777 to 787 MHz).

It is necessary that unwanted radiation in NS_07 be reduced to a predetermined level or lower. If the TCF of the filter 11 is set to satisfy the above relational expression (1), unwanted radiation in NS_07 can be reduced to the predetermined level or lower.

A front-end circuit 1 according to the embodiment includes an antenna connecting terminal 100, filters 11 and 21, a power amplifier 51, a switch 31, and a matching circuit 41. The filter 11 is connected to the antenna connecting terminal 100. The filter 21 is connected to the antenna connecting terminal 100 and has a pass band including a third uplink operating band of a third band whose frequency range does not overlap those of the first and second bands. The power amplifier 51 is able to amplify radio-frequency signals of the first, second, and third bands. The switch 31 selectively connects the filter 11 or the filter 21 to the power amplifier 51. The matching circuit 41 is connected between the power amplifier 51 and the switch 31 and varies the impedance in accordance with whether the switch 31 connects the filter 11 or the filter 21 to the power amplifier 51.

With this configuration, when the filter 11 is connected to the power amplifier 51, the matching circuit 41 can adjust its impedance so as to minimize the distortion of a signal amplified by the power amplifier 51. It is thus possible to secure a large attenuation in the attenuation bands adjacent to the first and second uplink operating bands.

The filter 11 is formed in or on a first substrate, while the filter 12 may be formed in or on a second substrate, which is different from the first substrate.

The filter 11 is formed in or on the first substrate in order to make the TCF small. In contrast, the filter 12 is free from the need to make the TCF small and may thus be formed in or on a substrate different from the first substrate. This enhances the flexibility in designing parameters, such as the electrode parameters, of the filter 12.

The electrodes forming the filter 11 may contact a first dielectric layer formed on the first substrate, while the electrodes forming the filter 12 may contact a second dielectric layer, which is different from the first dielectric layer, formed on the first substrate. The first and second dielectric layers are made of a material using silicon dioxide as a principal component, for example.

If the filter 11 is a SAW filter, a dielectric layer is formed on a piezoelectric substrate or a piezoelectric layer. This dielectric layer is formed to contact the IDT electrodes formed on the piezoelectric substrate or the piezoelectric layer and implements the following functions: (1) protecting the IDT electrodes from external environments; (2) adjusting the TCF of the filter 11; and (3) enhancing the moisture resistance. By varying the chemical composition or the film thickness of the dielectric layer, one or more of the above-described functions (1), (2), and (3) can be preferentially developed.

The electrodes forming the filter 11 are brought into contact with the first dielectric layer in order to make the TCF of the filter 11 small. In contrast, the filter 12 is free from the need to make the TCF small. The electrodes forming the filter 12 can thus be brought into contact with the second dielectric layer whose chemical composition or film thickness is different from the first dielectric layer, thereby enhancing the flexibility in designing parameters, such as the electrode parameters, of the filter 12. For example, to form the filter 12, which is free from the need to make the TCF small, the piezoelectric substrate or the piezoelectric layer can be designed in light of reducing unwanted waves.

[1.5 Advantages and Others]

An FDD first band includes a first downlink operating band and a first uplink operating band. An FDD second band includes a second downlink operating band and a second uplink operating band. In the FDD first band and the FDD second band, (1) the first downlink operating band, second downlink operating band, first uplink operating band, and second uplink operating band are positioned in order from lowest to highest frequency. The frequency range of the first uplink operating band and that of the second uplink operating band do not overlap each other. The filter 11 of the embodiment is formed in or on a single first substrate having piezoelectric properties and has a pass band including the first and second uplink operating bands.

According to the above-described frequency relationship between the first band and the second band, the first uplink operating band and the second uplink operating band are adjacent to each other without having the first and second downlink operating bands interposed therebetween. Because of this positional relationship, if a SAW filter is used to form the filter 11, the pass band including the first and second uplink operating bands of the filter 11 can be formed by using the same IDT electrode. Because of the characteristics of a SAW filter, the downlink operating bands adjacent to the pass band of the filter 11 can be sharply attenuated. It is thus possible to implement a small acoustic wave filter circuit which can use two uplink operating bands as the same pass band and which can sufficiently attenuate downlink operating bands adjacent to the pass band.

In one example, the first band may be LTE band B13, while the second band may be LTE band B14.

An FDD first band includes a first downlink operating band and a first uplink operating band. An FDD second band includes a second downlink operating band and a second uplink operating band. In the FDD first band and the FDD second band, the first downlink operating band, second uplink operating band, first uplink operating band, and second downlink operating band are positioned in order from lowest to highest frequency or from highest to lowest frequency. The frequency range of the first uplink operating band and that of the second uplink operating band do not overlap each other. The filter 11 of the embodiment is formed in or on a single first substrate having piezoelectric properties and has a pass band including the first and second uplink operating bands.

According to the above-described frequency relationship between the first band and the second band, the first uplink operating band and the second uplink operating band are adjacent to each other without having the first and second downlink operating bands interposed therebetween. Because of this positional relationship, if a SAW filter is used to form the filter 11, the pass band including the first and second uplink operating bands of the filter 11 can be formed by using the same IDT electrode. Because of the characteristics of a SAW filter, the downlink operating bands adjacent to the pass band of the filter 11 can be sharply attenuated. It is thus possible to implement a small acoustic wave filter circuit which can use two uplink operating bands as the same pass band and which can sufficiently attenuate downlink operating bands adjacent to the pass band.

A TDD first band includes a first downlink operating band and a first uplink operating band. An FDD second band includes a second downlink operating band and a second uplink operating band. In the TDD first band and the FDD second band, the first downlink operating band and the first uplink operating band have the same frequency range. The first band, second uplink operating band, and second downlink operating band may be positioned in order from lowest to highest frequency. It is possible that the frequency range of the first band and that of the second uplink operating band do not overlap each other. The filter 11 of the embodiment may be formed in or on a single first substrate having piezoelectric properties and have a pass band including the first and second uplink operating bands.

According to the above-described frequency relationship between the first band and the second band, the TDD first band and the FDD second uplink operating band are adjacent to each other without having the second downlink operating band interposed therebetween. Because of this positional relationship, if a SAW filter is used to form the filter 11, the pass band including the first and second uplink operating bands of the filter 11 can be formed by using the same IDT electrode. Because of the characteristics of a SAW filter, the downlink operating bands adjacent to the pass band of the filter 11 can be sharply attenuated. It is thus possible to implement a small acoustic wave filter circuit which can use two uplink operating bands as the same pass band and which can sufficiently attenuate downlink operating bands adjacent to the pass band.

In one example, the first band may be LTE band B52, while the second band may be LTE band B22.

The TCF (ppm/° C.) of the filter 11 of the embodiment may satisfy the following relational expression (1):

$$TCF \leq |[(f0 \pm fgap/4) - f0]/f0/\Delta T \times 1000000| \quad (1)$$

where f0 is the center frequency (Hz) of the pass band of the filter 11, fgap is the frequency gap (Hz) between the first uplink operating band and the first or second downlink operating band adjacent to the first uplink operating band, and ΔT is the largest temperature shift from room temperature.

When the TCF of the filter 11 satisfies the above relational expression (1), a large attenuation can be secured in the attenuation band on the lower frequency side of the pass band under high temperatures, while a large attenuation can be secured in the attenuation band on the higher frequency side of the pass band under low temperatures.

A multiplexer according to the embodiment includes an antenna connecting terminal 100 and filters 11 and 12. The filter 11 is connected to the antenna connecting terminal 100. The filter 12 is connected to the antenna connecting terminal 100 and has a pass band including first and second downlink operating bands. The filter 12 is formed in or on a second substrate, which is different from the first substrate.

The filter 11 is formed in or on the first substrate in order to make the TCF small. In contrast, the filter 12 is free from the need to make the TCF small and may thus be formed in or on a substrate different from the first substrate. This enhances the flexibility in designing parameters, such as the electrode parameters, of the filter 12. It is thus possible to implement a small multiplexer which can secure the isolation between a sending signal and a received signal.

A multiplexer according to the embodiment includes an antenna connecting terminal 100 and filters 11 and 12. The filter 11 is connected to the antenna connecting terminal 100. The filter 12 is connected to the antenna connecting terminal 100 and has a pass band including first and second downlink operating bands. Electrodes forming the filter 11 contact a first dielectric layer formed on the first substrate. Electrodes forming the filter 12 contact a second dielectric layer, which is different from the first dielectric layer, formed on the first substrate.

The electrodes forming the filter 11 are brought into contact with the first dielectric layer in order to make the TCF of the filter 11 small. In contrast, the filter 12 is free from the need to make the TCF small. The electrodes forming the filter 12 can thus be brought into contact with the second dielectric layer, thereby enhancing the flexibility in designing parameters, such as the electrode parameters, of the filter 12. For example, to form the filter 12, which is free from the need to make the TCF small, the piezoelectric substrate or the piezoelectric layer can be designed in light of reducing unwanted waves.

A front-end circuit 1 according to the embodiment may include an antenna connecting terminal 100, filters 11 and 21, a power amplifier 51, a switch 31, and a matching circuit 41. The filter 11 is connected to the antenna connecting terminal 100. The filter 21 is connected to the antenna connecting terminal 100 and has a pass band including a third uplink operating band of a third band. The frequency range of the third band overlaps neither of the first band nor the second band. The power amplifier 51 is able to amplify radio-frequency signals of the first, second, and third bands. The switch 31 selectively connects the filter 11 or the filter 21 to the power amplifier 51. The matching circuit 41 is connected between the power amplifier 51 and the switch 31 and varies the impedance in accordance with whether the switch 31 connects the filter 11 or the filter 21 to the power amplifier 51.

With this configuration, when the filter 11 is connected to the power amplifier 51, the matching circuit 41 can adjust its impedance so as to minimize the distortion of a signal amplified by the power amplifier 51. It is thus possible to secure a large attenuation in the attenuation bands adjacent to the first and second uplink operating bands.

A communication apparatus 5 according to the embodiment includes an RFIC 3 that processes a radio-frequency signal and the front-end circuit 1 that transmits the radio-frequency signal between the RFIC 3 and the antenna 2.

With this configuration, the communication apparatus 5 achieves advantages similar to those of the front-end circuit 1.

Other Embodiments

The acoustic wave filter circuit, multiplexer, front-end circuit, and communication apparatus have been discussed above through illustration of the above-described embodiment. However, the acoustic wave filter circuit, multiplexer, front-end circuit, and communication apparatus according to an embodiment of the disclosure are not restricted to those in the above-described embodiment. Other embodiments implemented by combining certain components in the above-described embodiment and other modified examples obtained by making various modifications to the above-described embodiment by those skilled in the art without departing from the scope and spirit of the disclosure are also encompassed. Various devices integrating any of the above-described acoustic wave filter circuit, multiplexer, front-end circuit, and communication apparatus are also encompassed in the disclosure.

For example, in the circuit configurations of the acoustic wave filter circuit, multiplexer, front-end circuit, and communication apparatus according to the embodiment, another circuit element and/or another wiring may be inserted onto a path connecting circuit elements and/or a path connecting signal paths illustrated in the drawings.

In the above-described embodiment, 5G-NR or LTE bands are used. In addition to or instead of 5G-NR or LTE, a communication band for another RAT may be used. For example, a communication band for a WLAN may be used.

Additionally, a millimeter-wave band of 7 GHz or higher may be used. In this case, the front-end circuit 1, the antenna 2, and the RFIC 3 may form a millimeter-wave antenna module, and a distributed-element filter may be used as a filter.

The embodiments disclosed herein can be widely used for a communication apparatus, such as a cellular phone, as a radio-frequency circuit provided in a front-end portion.

What is claimed is:

1. An acoustic wave filter circuit, wherein:
in a first band and a second band, the first band being used for frequency division duplex (FDD) communication and including a first downlink operating band and a first uplink operating band, the second band being used for FDD communication and including a second downlink operating band and a second uplink operating band,
(1) the first downlink operating band, the second downlink operating band, the first uplink operating band, and the second uplink operating band are positioned in order from lowest to highest frequency or from highest to lowest frequency or (2) the first downlink operating band, the first uplink operating band, the second uplink operating band, and the second downlink operating band are positioned in order from lowest to highest frequency or from highest to lowest frequency;
a frequency range of the first uplink operating band and a frequency range of the second uplink operating band do not overlap; and
the acoustic wave filter circuit is formed in or on a first substrate having piezoelectric properties and has a pass band including the first and second uplink operating bands.

2. The acoustic wave filter circuit of claim 1, wherein:
the first band is band B13 for long term evolution; and
the second band is band B14 for long term evolution.

3. The acoustic wave filter circuit of claim 1, wherein a temperature coefficient of frequency TCF (ppm/° C.) of the acoustic wave filter circuit satisfies a relational expression represented by:

$$TCF \leq |[(f0 \pm fgap/4) - f0]/f0/\Delta T \times 1000000| \quad (1)$$

where f0 is a center frequency (Hz) of the pass band, fgap is a frequency gap (Hz) between the first uplink operating band and the first or second downlink operating band adjacent to the first uplink operating band, and ΔT is a largest temperature shift from room temperature.

4. A multiplexer comprising:
an antenna connecting terminal;
the acoustic wave filter circuit according to claim 1, the acoustic wave filter circuit being connected to the antenna connecting terminal; and
a first filter circuit that is connected to the antenna connecting terminal and that has a pass band including the first and second downlink operating bands, wherein
the first filter circuit is formed in or on a second substrate, the second substrate being different from the first substrate.

5. A multiplexer comprising:
an antenna connecting terminal;
the acoustic wave filter circuit according to claim 1, the acoustic wave filter circuit being connected to the antenna connecting terminal; and
a first filter circuit that is connected to the antenna connecting terminal and that has a pass band including the first and second downlink operating bands, wherein an electrode forming the acoustic wave filter circuit contacts a first dielectric layer formed on the first substrate, and
an electrode forming the first filter circuit contacts a second dielectric layer formed on the first substrate, the second dielectric layer being different from the first dielectric layer.

6. A front-end circuit comprising:
an antenna connecting terminal;
the acoustic wave filter circuit according to claim 1, the acoustic wave filter circuit being connected to the antenna connecting terminal;
a second filter circuit that is connected to the antenna connecting terminal and that has a pass band including a third uplink operating band of a third band, a frequency range of the third band overlapping neither of the first band nor the second band;
a power amplifier configured to amplify radio-frequency signals of the first, second, and third bands;
a switch configured to selectively connect the acoustic wave filter circuit or the second filter circuit to the power amplifier; and
an impedance matching circuit that is connected between the power amplifier and the switch and configured to vary impedance in accordance with whether the switch connects the acoustic wave filter circuit or the second filter circuit to the power amplifier.

7. A communication apparatus comprising:
a signal processing circuit configured to process a radio-frequency signal; and
the front-end circuit according to claim 6, the front-end circuit configured to transmit the radio-frequency signal between the signal processing circuit and an antenna.

8. An acoustic wave filter circuit, wherein:
in a first band and a second band, the first band being used for frequency division duplex (FDD) communication and including a first downlink operating band and a first uplink operating band, the second band being used for FDD communication and including a second downlink operating band and a second uplink operating band,
the first downlink operating band, the second uplink operating band, the first uplink operating band, and the second downlink operating band are positioned in order from lowest to highest frequency or from highest to lowest frequency;
a frequency range of the first uplink operating band and a frequency range of the second uplink operating band do not overlap; and
the acoustic wave filter circuit is formed in or on a first substrate having piezoelectric properties and has a pass band including the first and second uplink operating bands.

9. The acoustic wave filter circuit of claim 8, wherein:
the first band is band B201 for a non-terrestrial network; and
the second band is band B255 for a non-terrestrial network.

10. The acoustic wave filter circuit of claim 8, wherein a temperature coefficient of frequency TCF (ppm/° C.) of the acoustic wave filter circuit satisfies a relational expression represented by:

$$TCF \leq |[(f0 \pm fgap/4) - f0]/f0/\Delta T \times 1000000| \quad (1)$$

where f0 is a center frequency (Hz) of the pass band, fgap is a frequency gap (Hz) between the first uplink operating band and the first or second downlink operating band adjacent to the first uplink operating band, and ΔT is a largest temperature shift from room temperature.

11. A multiplexer comprising:
an antenna connecting terminal;
the acoustic wave filter circuit according to claim 8, the acoustic wave filter circuit being connected to the antenna connecting terminal; and
a first filter circuit that is connected to the antenna connecting terminal and that has a pass band including the first and second downlink operating bands, wherein
the first filter circuit is formed in or on a second substrate, the second substrate being different from the first substrate.

12. A multiplexer comprising:
an antenna connecting terminal;
the acoustic wave filter circuit according to claim 8, the acoustic wave filter circuit being connected to the antenna connecting terminal; and
a first filter circuit that is connected to the antenna connecting terminal and that has a pass band including the first and second downlink operating bands, wherein
an electrode forming the acoustic wave filter circuit contacts a first dielectric layer formed on the first substrate, and
an electrode forming the first filter circuit contacts a second dielectric layer formed on the first substrate, the second dielectric layer being different from the first dielectric layer.

13. A front-end circuit comprising:
an antenna connecting terminal;
the acoustic wave filter circuit according to claim 8, the acoustic wave filter circuit being connected to the antenna connecting terminal;
a second filter circuit that is connected to the antenna connecting terminal and that has a pass band including a third uplink operating band of a third band, a frequency range of the third band overlapping neither of the first band nor the second band;
a power amplifier configured to amplify radio-frequency signals of the first, second, and third bands;
a switch configured to selectively connect the acoustic wave filter circuit or the second filter circuit to the power amplifier; and
an impedance matching circuit that is connected between the power amplifier and the switch and configured to vary impedance in accordance with whether the switch connects the acoustic wave filter circuit or the second filter circuit to the power amplifier.

14. A communication apparatus comprising:
a signal processing circuit configured to process a radio-frequency signal; and
the front-end circuit according to claim 13, the front-end circuit configured to transmit the radio-frequency signal between the signal processing circuit and an antenna.

15. An acoustic wave filter circuit, wherein:
in a first band and a second band, the first band being used for time division duplex (FDD) communication and including a first downlink operating band and a first uplink operating band, the second band being used for FDD communication and including a second downlink operating band and a second uplink operating band,
the first downlink operating band and the first uplink operating band have an identical frequency range;
the first band, the second uplink operating band, and the second downlink operating band are positioned in order from lowest to highest frequency or from highest to lowest frequency;
a frequency range of the first band and a frequency range of the second uplink operating band do not overlap; and
the acoustic wave filter circuit is formed in or on a first substrate having piezoelectric properties and has a pass band including the first and second uplink operating bands.

16. The acoustic wave filter circuit of claim 15, wherein:
the first band is band B52 for long term evolution; and
the second band is band B22 for long term evolution.

17. The acoustic wave filter circuit of claim 15, wherein
a temperature coefficient of frequency TCF (ppm/° C.) of the acoustic wave filter circuit satisfies a relational expression represented by:

$$TCF \leq |[(f0 \pm fgap/4) - f0]/f0/\Delta T \times 1000000| \quad (1)$$

where f0 is a center frequency (Hz) of the pass band, fgap is a frequency gap (Hz) between the first uplink operating band and the first or second downlink operating band adjacent to the first uplink operating band, and ΔT is a largest temperature shift from room temperature.

18. A front-end circuit comprising:
an antenna connecting terminal;
the acoustic wave filter circuit according to claim 15, the acoustic wave filter circuit being connected to the antenna connecting terminal;
a second filter circuit that is connected to the antenna connecting terminal and that has a pass band including a third uplink operating band of a third band, a frequency range of the third band overlapping neither of the first band nor the second band;
a power amplifier configured to amplify radio-frequency signals of the first, second, and third bands;
a switch configured to selectively connect the acoustic wave filter circuit or the second filter circuit to the power amplifier; and
an impedance matching circuit that is connected between the power amplifier and the switch and configured to vary impedance in accordance with whether the switch connects the acoustic wave filter circuit or the second filter circuit to the power amplifier.

19. A communication apparatus comprising:
a signal processing circuit configured to process a radio-frequency signal; and
the front-end circuit according to claim 18, the front-end circuit configured to transmit the radio-frequency signal between the signal processing circuit and an antenna.

* * * * *